United States Patent [19]
Little

[11] Patent Number: 6,023,184
[45] Date of Patent: Feb. 8, 2000

[54] CONVERTER PROVIDING DIGITAL SCALING AND MIXING

[75] Inventor: James M. Little, Emmaus, Pa.

[73] Assignee: Lucent Technologies Inc., Murray Hill, N.J.

[21] Appl. No.: 08/975,901

[22] Filed: Sep. 16, 1997

Related U.S. Application Data

[60] Provisional application No. 60/051,722, Jul. 3, 1997.

[51] Int. Cl.[7] .............................. G06G 7/42; H03M 3/00
[52] U.S. Cl. .......................................... 327/336; 341/143
[58] Field of Search ..................................... 327/336, 337, 327/339, 345, 350–352, 355–361; 341/143, 144, 146, 155

[56] References Cited

U.S. PATENT DOCUMENTS

| | | | |
|---|---|---|---|
| 5,353,309 | 10/1994 | Agazzi et al. | 375/59 |
| 5,579,247 | 11/1996 | Kerth et al. | 364/571.02 |
| 5,673,044 | 9/1997 | Pellon | 341/143 |
| 5,712,874 | 1/1998 | Okamoto | 375/243 |
| 5,768,315 | 6/1998 | Mittel et al. | 375/247 |
| 5,815,102 | 9/1998 | Melanson | 341/143 |

*Primary Examiner*—My-Trang Nu Ton
*Attorney, Agent, or Firm*—John P. Veschi

[57] ABSTRACT

A converter includes at least two series coupled integrators, a comparator and a feedback element. The converter provides digital domain scaling so that an output signal is a scaled version of an input signal based on a feedback factor of the feedback element.

25 Claims, 6 Drawing Sheets

CONVERTER PROVIDING DIGITAL SCALING AND MIXING

Priority of U.S. Provisional Application Serial No. 60/051722, filed Jul. 3, 1997, is here claimed. This application is related to copending U.S. application Ser. No. 08/976,105, entitled "Dithered Digital Gain Scalar/Summer" (Hendricks 2), filed on even date herewith and incorporated herein by reference.

BACKGROUND OF THE INVENTION

Multi-media systems typically require the mixing and scaling of audio signals. Traditionally, these operations are performed in the analog domain with switched capacitor circuits. Such conventional circuits typically provide analog mixing and scaling of one or more signals either through a switched capacitor circuit or resistor circuit, followed by oversampling in a delta sigma converter to convert the mixed and scaled signal to the digital domain as a pulse density demodulated (PDM) signal.

A drawback of conventional analog scalars is that they require a ratio of capacitors or resistors approach to scaling. It can be difficult to achieve exact scaling with such circuits, which require very accurately matched components. Another drawback is that in conventional systems a signal to noise ratio of a composite signal is degraded in proportion to the number of signals comprising the composite signal. Still another drawback is that conventional circuits degrade the signal to noise ratio of input signals. Thus, there is a need for a circuit that can achieve mixing and scaling of audio signals in the digital domain.

SUMMARY OF THE INVENTION

In accordance with one embodiment according to the invention, a converter including at least two series coupled integrators, a comparator and a feedback element provides digital domain scaling so that an output signal is a scaled version of an input signal based on a feedback factor of the feedback element.

DETAILED DESCRIPTION

Figure 1:
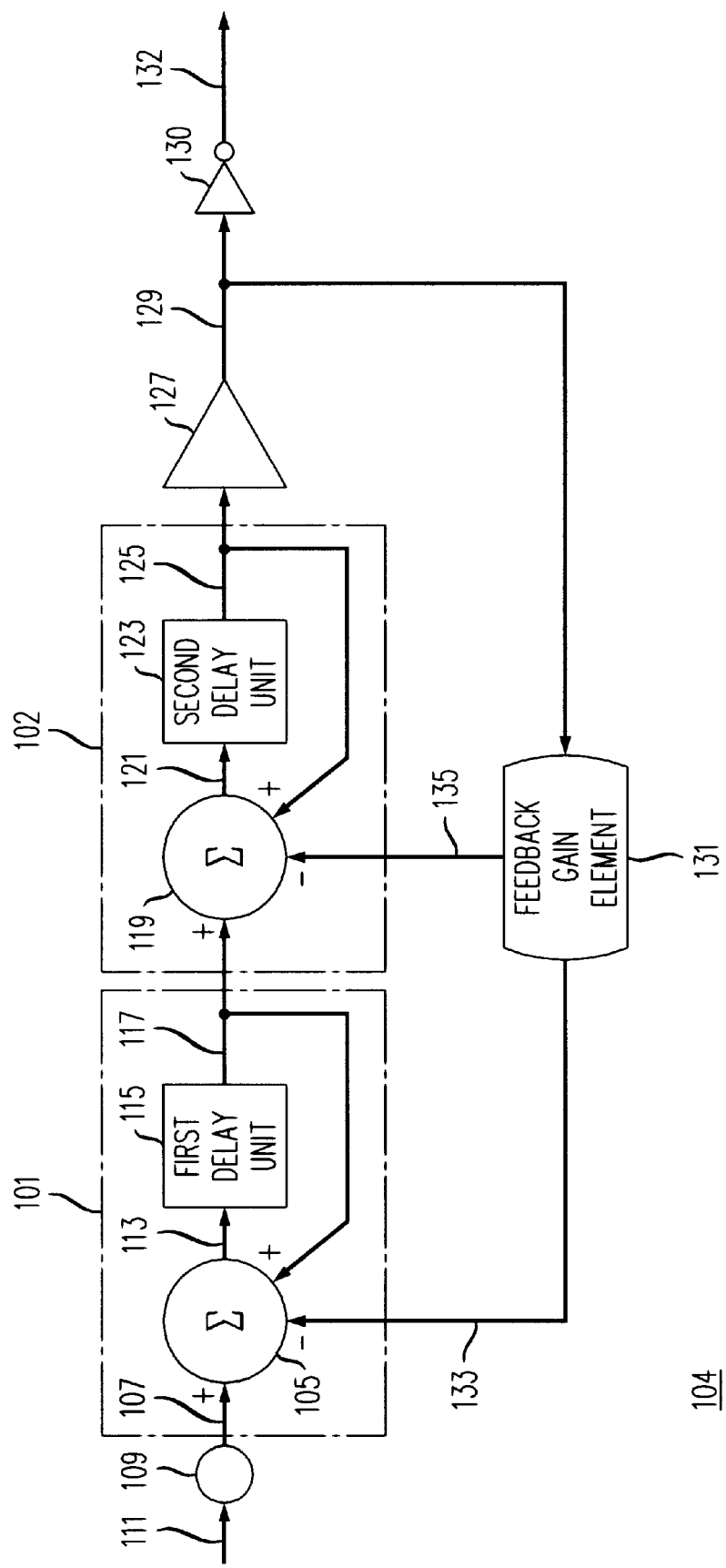
FIG. 1 is a simplified block diagram showing a converter according to the invention.

FIG. 1 shows converter 104, according to one embodiment of the invention, comprising a first integrator 101 connected in series with a second integrator 102, a comparator 127, and a feedback gain element 131. According to the invention, an input signal provided to first integrator 101 is output in a scaled manner by comparator 127 according to a feedback factor of feedback gain element 131. The number of integrators employed in this example is purely by way of example and not of limitation. Any number of integrators can be employed. If the input signal provided on input line 111 is from a PDM source, then the number of integrators in converter 104 is preferably equal to or greater than a number of integrators in the PDM source.

Converter 104 also optionally includes an input gain element 109 and an inverter 130. When input gain element 109 is employed, converter 104 scales an input signal based on both the feedback factor of feedback gain element 131 and an input gain factor of input gain element 109. When inverter 130 is employed, the output of comparator 127 is inverted prior to being output from the converter. Inverter 130 can be used in certain implementations, such as in a two's complement implementation, to correct for phase inversions introduced by one or more of the aforementioned circuit elements.

First integrator 101 includes a first summer 105 and a first delay unit 115. First summer 105 receives a gain adjusted signal 107, which is a gain adjusted version of an input signal provided on input line 111, from input gain element 109. A first output 113 of first summer 105 is provided to first delay unit 115. A first delayed output 117 of first delay unit 115 is fed back to first summer 105, and is provided to second integrator 102. Second integrator 102 includes a second summer 119 and a second delay unit 123. A second output 121 of second summer 119 is provided to second delay unit 123. A second delayed output 125 of second delay unit 123 is fed back to second summer 119 and is provided to comparator 127. A comparator output 129 (or an inverted output 132 for circuits including inverter 130) represents a scaled version of input signal 111, and serves as an output signal of converter 104. Comparator output 129 is also fed back to feedback gain element 131 which provides a first feedback signal 133 to first summer 105 and a second feedback signal 135 to second summer 119.

In an example of the embodiment of FIG. 1, the input signal received on input line 111 comprises a one-bit Pulse Density Modulated (PDM) signal stream such that input gain element 109 is adapted to receive one-bit digital signals. In this example, comparator 127 is adapted to produce a PDM stream comprising a scaled version of the input signal stream as comparator output 129.

Figure 2:
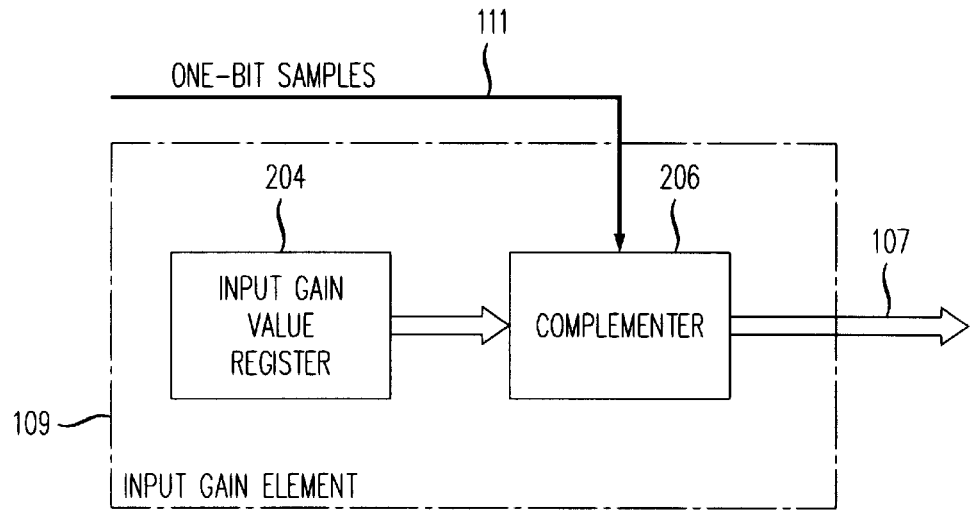
FIG. 2 is a simplified block diagram showing a construction of input gain element 109 of FIG. 1.

FIG. 2 shows a simplified block diagram of input gain element 109, including an input gain value register 204 and a complementer 206. Input gain value register 204 contains an input gain factor as, for example, a multibit value, such as, for example, a 12-bit value. Input gain value register 204 supplies this input gain factor to complementer 206. Complementer 206 also receives the one-bit PDM input signals provided on input line 111. In response to each bit of the PDM input signal stream, complementer 206 outputs either the input gain factor supplied by input gain value register 204, or the complement of the input gain factor supplied by input gain value register 204, as gain adjusted signal 107 to first summer 105.

For example, if the input signal provided on input line 111 has a first logical state, such as a logical 1, complementer 206 outputs the input gain factor as gain adjusted signal 107. Alternatively, if the input signal provided on input line 111 has a second logical state, such as a logical 0, complementer 206 outputs the complement of the input gain factor as gain adjusted signal 107.

Figure 3:
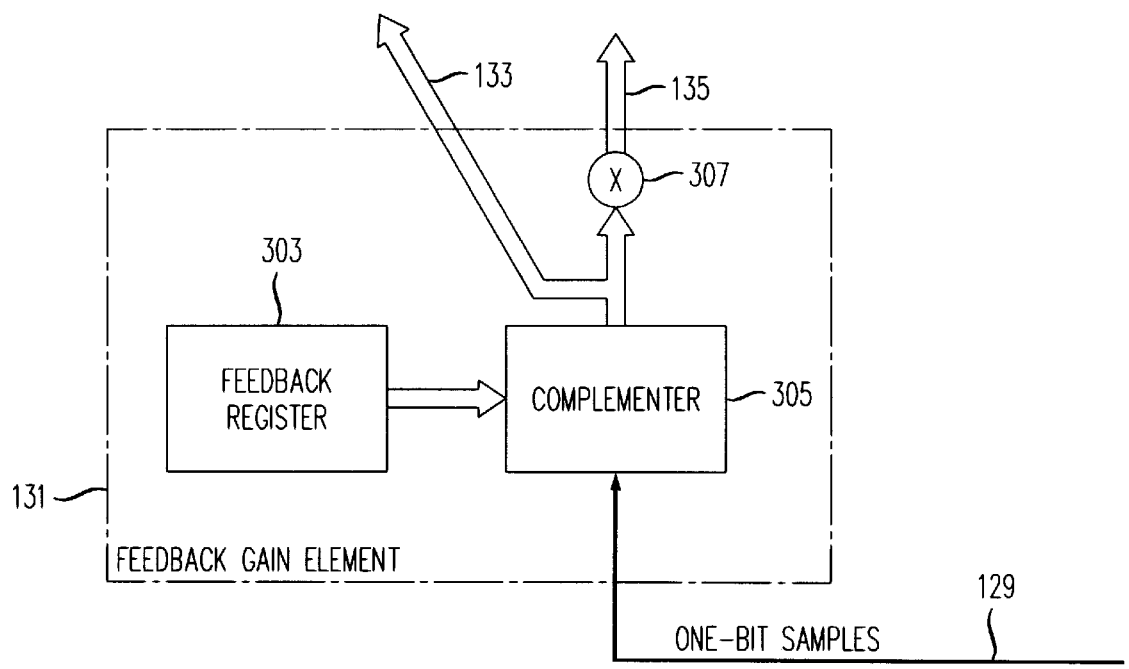
FIG. 3 is a simplified block diagram showing a construction of feedback element 131 of FIG. 1.

FIG. 3 shows a simplified block diagram of feedback gain element 131, including feedback register 303, complementer 305, and multiplier 307. Feedback register 303 contains a feedback factor as, for example, a multibit value, such as, for example, a 12-bit value. Feedback register 303 provides the feedback factor to complementer 305. Complementer 305 receives the one-bit PDM output signals of comparator 127 provided on comparator output line 129. In response to each bit of the output, complementer 305 outputs either the feedback factor or the complement of the feedback factor as the first feedback signal 133.

For example, if a specific bit of the PDM output signal stream has a first logical state, complementer 305 outputs the feedback factor as the first feedback signal 133. Alternatively, if the specific bit has a second logical state, complementer 305 outputs the complement of the feedback factor as the first feedback signal 133. The first logical state and the second logical state are, for example, logical 1 and logical 0, respectively. The first feedback signal is provided to first summer 105 (FIG. 1) and is also provided to multiplier 307 which produces the second feedback signal 135 to be supplied to second summer 119. The second feedback signal is, for example, twice the first feedback signal. The 2:1 relationship between the first feedback signal 133 and the second feedback signal 135 is merely by way of example and not of limitation. Other relationships can be employed according to the invention, depending on the stability requirements of a specific application.

Operationally, with reference again to FIG. 1, converter 104 receives a PDM input signal stream on input line 111, and outputs a scaled version of the PDM input signal stream on output line 132. As discussed earlier, input gain element 109 outputs multibit gain-adjusted signal 107, comprising either the input gain factor or the complement of the input gain factor. First summer 105 also receives a multibit signal, such as, for example, a 12-bit signal, from feedback gain element 131 as first feedback signal 133. First summer 105 also receives a multibit signal from first delay unit 115. First summer 105 produces first output 113 which is provided to second summer 119 via first delay unit 115 as first delayed output 117.

Similarly, second summer 119 receives as multibit signals the first delayed output 117, second feedback signal 135, and second delayed output 125. Second summer 119 provides multibit second output 121 to comparator 127 as second delayed output 125 via second delay unit 123.

As is known in the art of sigma delta converters, comparator 127 receives multibit second delayed output 125 and produces therefrom a one-bit PDM signal stream provided on output line 129. The one-bit PDM signal stream produced by comparator 127 typically consists of the sign bits of the samples of multibit second delayed output 125. As discussed earlier, this PDM signal stream is also fed back to feedback gain element 131 to affect the first and second feedback signals 133 and 135 provided respectively to first summer 105 and second summer 119. According to the invention, the PDM signal stream output from converter 104 on output line 132 is a scaled version of the PDM signal stream input to converter 104 on input line 111. A scaling factor of converter 104 is the input gain factor, stored in input gain value register 204, divided by the feedback gain factor, stored in feedback register 303.

First summer 105 and second summer 119 respectively receive the first and second feedback signals 133 and 135 as negative feedback. Thus, operationally, the sign bit of multibit second delayed output 125, which is output by comparator 127 as comparator output 129, determines the sign of the first feedback signal 133 and thus determines if first summer 105 will subtract the feedback gain factor stored in feedback register 131, or will subtract the complement of the feedback gain factor. As is clear to one of ordinary skill in the art, when first summer 105 subtracts the complement of the feedback gain factor, it is essentially adding the feedback gain factor.

Similarly, the sign bit of multibit second delayed output 125, as comparator output 129, determines the sign of the second feedback signal 135 and thus determines if second summer 119 subtracts a multiple of the feedback gain factor or subtracts a multiple of the complement of the feedback gain factor when it receives the second feedback signal 135.

Gain adjusted signal 107, first output 113, first delayed output 117, second output 121, second delayed output 125, first feedback signal 133, and second feedback signal 135 are all described as multibit signals. Preferably, the sizes (i.e., number of bits) of these signals are selected to allow appropriate room for accumulation. Thus, for example, gain adjusted signal 107 and the first feedback signal 133 can each have 12 bits, while the second feedback signal 135 has 13 bits. In such a case, first output 113 and first delayed output 117 can have, for example, 14 bits, while second output 121 and second delayed output 125 have, for example, 16 bits.

Operationally, more than one feedback register can be employed in feedback gain element 131 such that the feedback gain factor can be selected from the values stored in the feedback registers according to user input or program control. Similarly, more than one input gain value register can be employed in input gain element 109 such that the input gain factor can be selected according to user input or program control.

Figure 4:
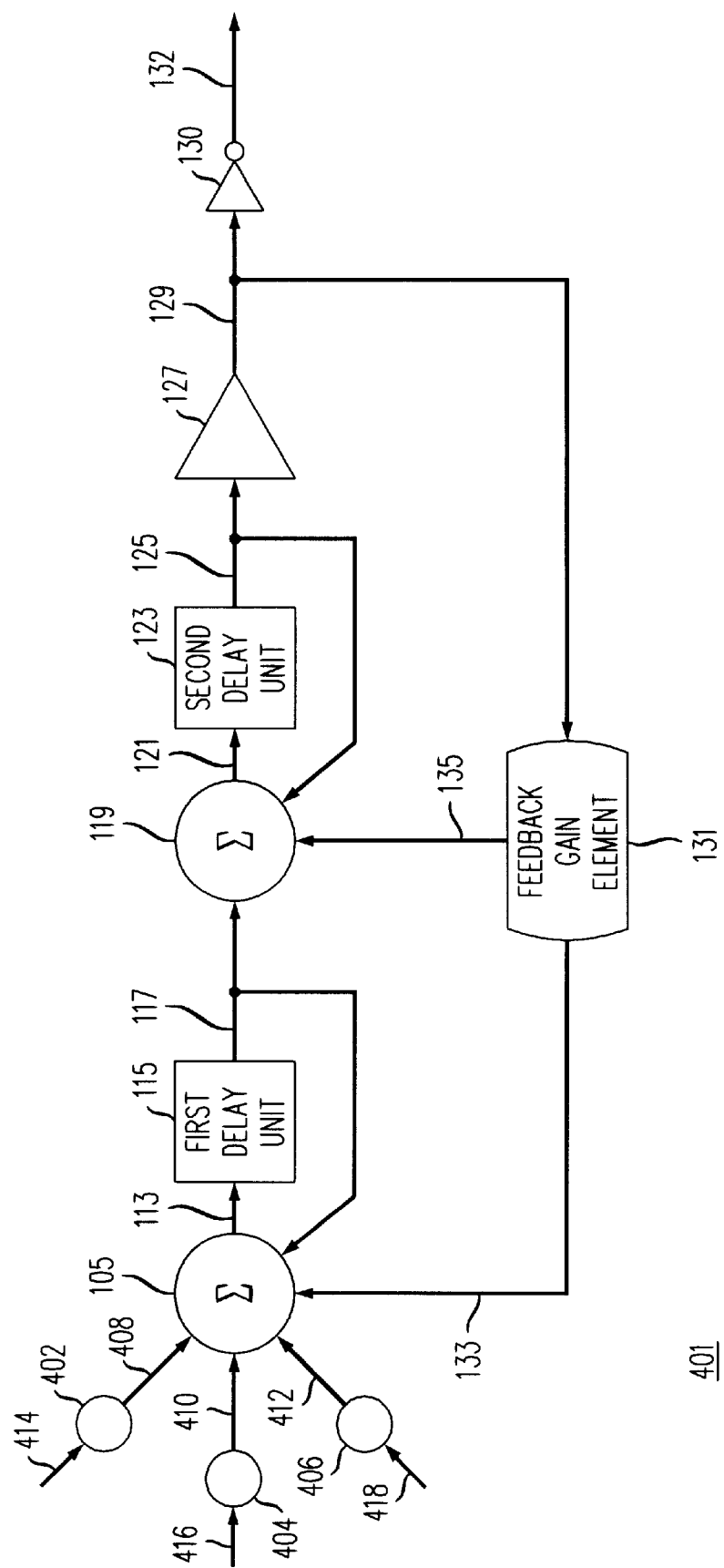
FIG. 4 is a simplified block diagram of an alternative converter according to the invention.

FIG. 4 shows converter 401 including a plurality of input gain elements, for example, three input gain elements 402, 404 and 406, providing gain-adjusted signals 408, 410 and 412, respectively, to first summer 105. Input gain elements 402, 404 and 406, each operating in a manner similar to input gain element 109 of converter 104, produce these gain-adjusted signals based on PDM input signals received on input lines 414, 416 and 418, respectively. The remaining elements of converter 401 are functionally similar to those of converter 104 shown in FIG. 1, and thus contain like designations. Converter 401 produces a one-bit PDM output signal stream on output line 132 that includes a summed version of scaled input signals relating to the PDM input signals received on input lines 414, 416 and 418.

Converter 401 can independently scale each input signal based on an input gain factor of the corresponding input gain element (402, 404 and 406) and the feedback gain factor of feedback gain element 131. Thus, the scaling factor for the input signal on input line 414 is a function of the input gain factor of input gain element 402 and the feedback gain factor, such as, for example, the input gain factor of input gain element 402 divided by the feedback gain factor. Similarly, the scaling factors of the input signals on input lines 416 and 418 are functions of the respective input gain factors of input gain elements 404 and 406 with respect to the feedback gain factor. For example, the scaling factor for the input signal on input line 416 is the input gain factor of input gain element 404 divided by the feedback gain factor, and the scaling factor for the input signal on input line 418 is the input gain factor for input gain element 406 divided by the feedback gain factor.

Figure 5:
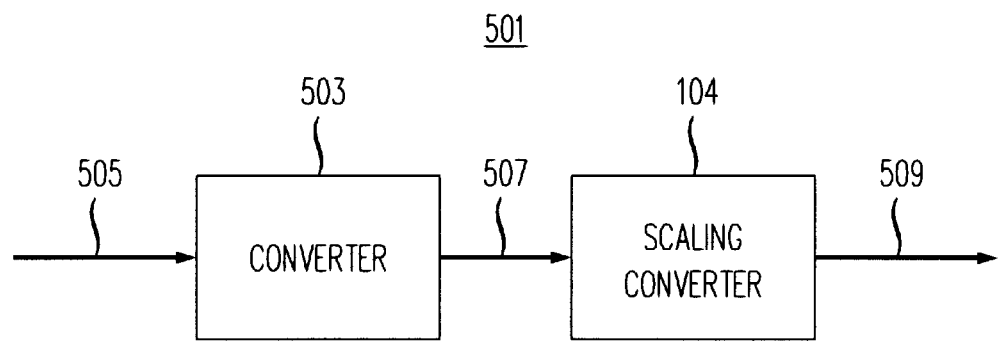
FIG. 5 is a simplified block diagram showing an interface unit including a converter according to the invention.

Converter 104 or converter 401 can be integrated into an interface unit such as an analog-to-digital converter portion of a codec. FIG. 5 provides a simplified block diagram of interface unit 501 as a generic example of this concept. Interface unit 501 comprises a converter 503 receiving an input signal on input line 505 and producing PDM stream 507 therefrom. Converter 503 is any device, such as, for example, an analog-to-digital converter or a digital-to-digital converter. The essential feature of converter 503 in this example is that it produces a PDM output stream from its input. Interface unit 501 also includes converter 104 which is a scaling converter according to the invention. Converter 104 receives the PDM stream 507 and produces, as an output signal on output line 509, a scaled version of the PDM stream 507. Thus, interface unit 501 provides a one-bit PDM output stream that is a scaled version of an input signal received on input line 505.

Figure 6:
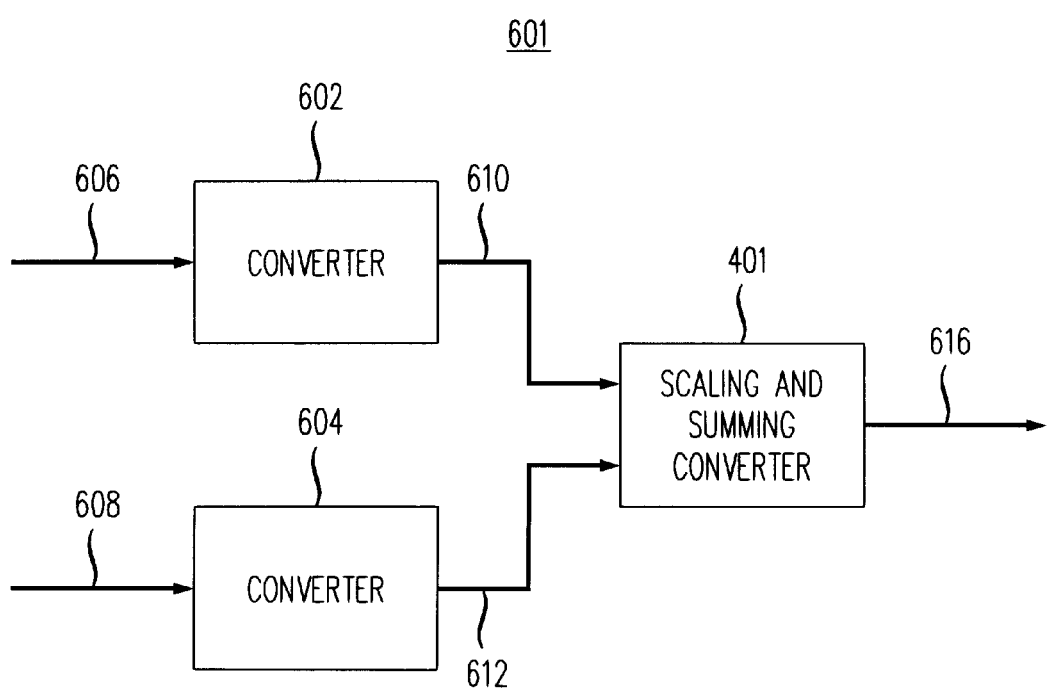
FIG. 6 is a simplified block diagram showing an example of an alternative interface unit including a converter according to the invention.

Interface unit 601, shown in FIG. 6, extends this concept to employ converter 401 and multiple input signals. Interface unit 601 includes, in addition to converter 401, a plurality of converters, such as, for example, two converters 602 and 604, that receive input signals on signal lines 606 and 608, respectively. Converter 602 produces PDM stream 610 from the input signal received on signal line 606. Similarly, converter 604 produces PDM stream 612 from the input signal received on signal line 608. Converter 401, which is a scaling and summing converter according to the invention, receives PDM streams 610 and 612 and produces, as output on line 616, a scaled and summed version of PDM streams 610 and 612.

Figure 7:
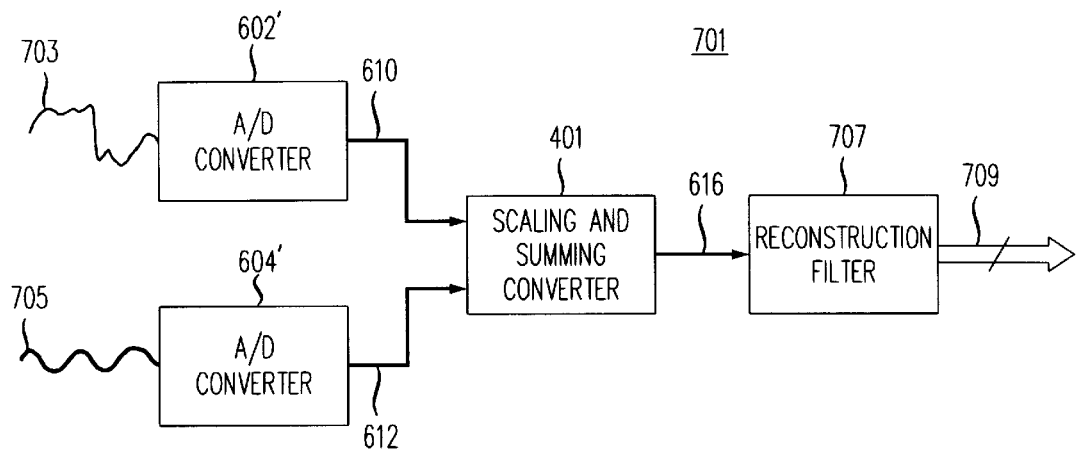
FIG. 7 is a simplified block diagram showing an example of the embodiment of FIG. 6.

Interface unit 701, shown in FIG. 7, is an example of interface unit 601 wherein converters 602' and 604' are analog-to-digital converters. Analog-to-digital converters 602' and 604' thus convert analog input signals 703 and 705 to PDM streams 610 and 612. Scaling and summing converter 401 then converts PDM streams 610 and 612 to scaled and summed version 616. Interface unit 701 also includes reconstruction filter 707 that receives the scaled and summed version 616 and produces multibit samples, such as, for example, 16-bit samples to be output therefrom on bus 709.

Figure 8:
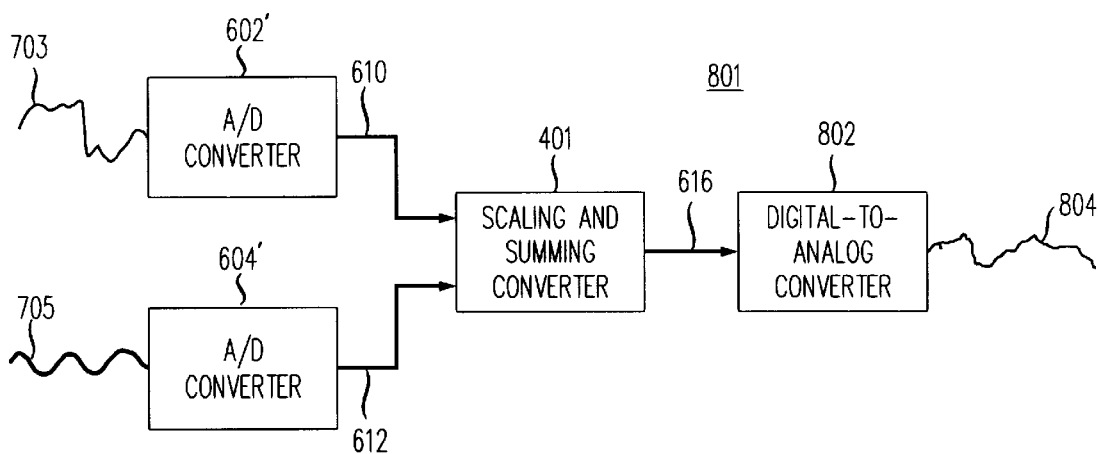
FIG. 8 is a simplified block diagram showing another alternative of the embodiment of FIG. 6.

Interface unit 801, shown in FIG. 8, is similar to interface unit 701. The difference in this embodiment is the use of digital-to-analog converter 802 in place of reconstruction filter 707. Digital-to-analog converter 802 receives the scaled and summed output 616 of scaling and summing converter 401 and produces, as output signal 804, a scaled and summed analog signal. Thus, signal 804 comprises a summed and scaled version of input signals 703 and 705. By way of comparison, the multibit samples output on bus 709 from interface unit 701 will appear as digital representations of analog signal 804 produced by the interface unit 801.

Figure 9:
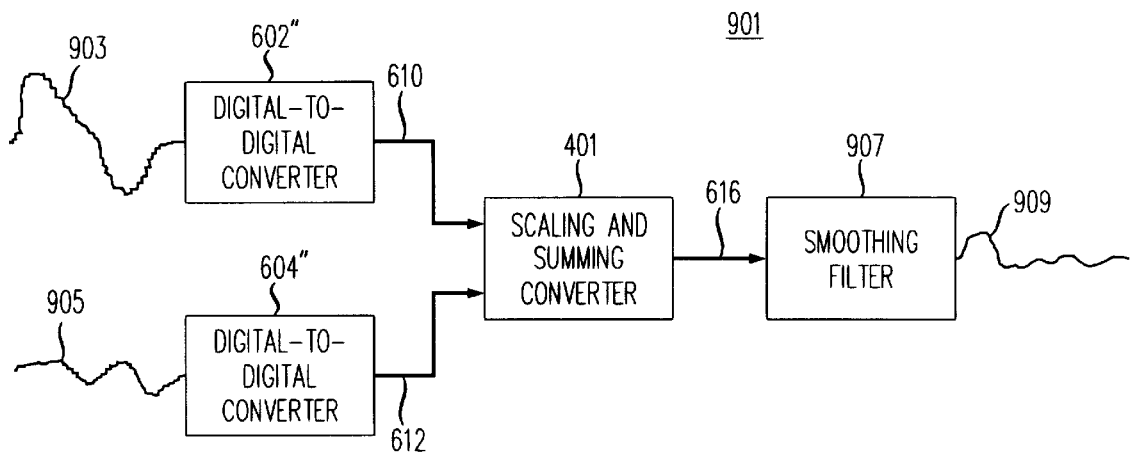
FIG. 9 is a simplified block diagram showing yet another example of the embodiment of FIG. 6.

Interface unit 901, shown in FIG. 9, is a related example employing digital-to-digital converters 602" and 604". Input signals 903 and 905 are multibit digital samples. Digital-to-digital converters 602" and 604" convert multibit digital samples 903 and 905 to PDM streams 610 and 612. The output of scaling and summing converter 401 is provided to smoothing filter 907. Smoothing filter 907 receives the scaled and summed version 616 and produces scaled and summed analog signal 909 therefrom.

Figure 10:
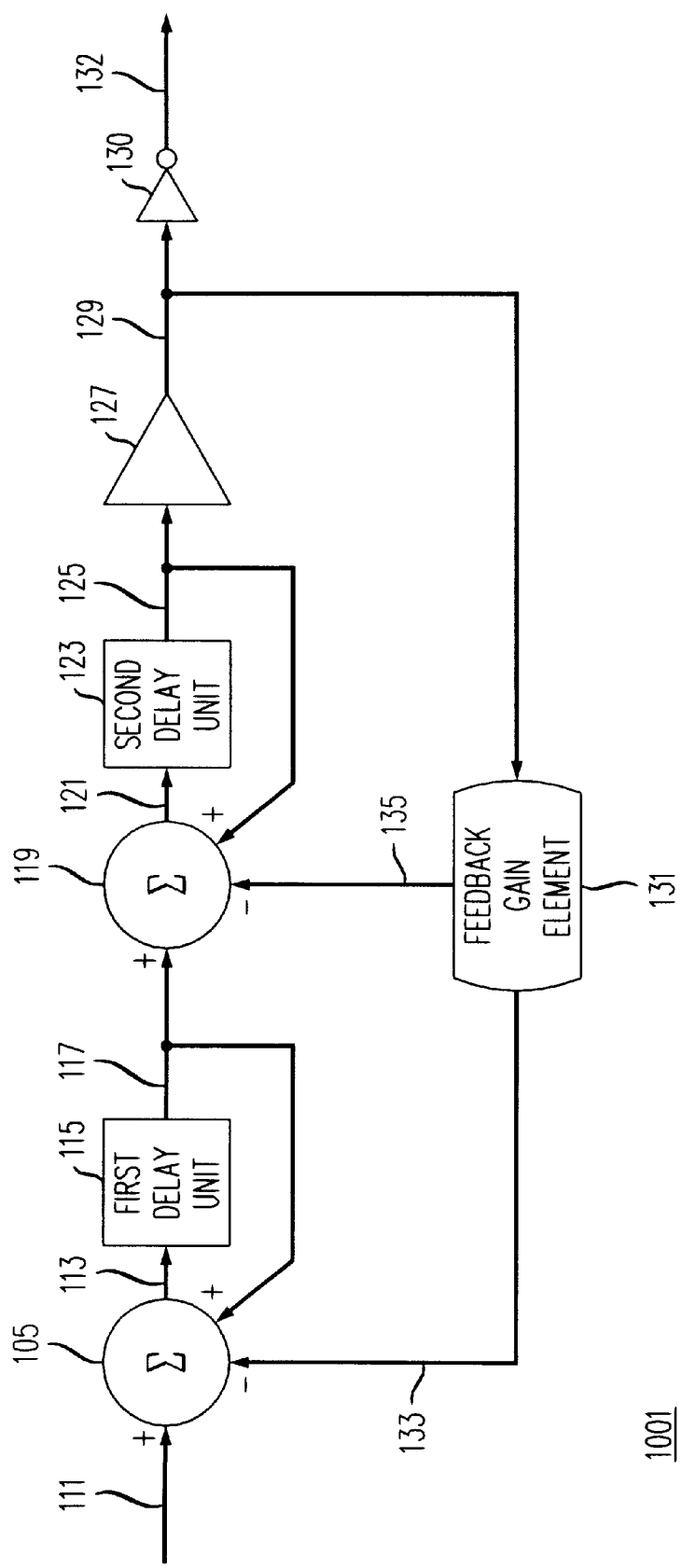
FIG. 10 is a simplified block diagram showing another alternative converter according to the invention.

Converter 1001, shown in FIG. 10, is a variation of converter 104. The input signal provided on input line 111 is a multibit signal. As shown, converter 1001 differs from converter 104 in that converter 1001 does not include an input gain element, such as input gain element 109 of converter 104. In this example, first summer 105 receives the multibit input signal provided on input line 111 and produces multibit first output 113 as a function of the multibit input signal, a previous multibit first output fed back from first delay unit 115, and the multibit first feedback signal 133. The remaining elements of converter 1001 operate as those of converter 104. The scaling factor of converter 1001 is a function of the input signal provided on input line 111 and the feedback gain factor.

A converter according to the invention as described above operates to provide scaling and/or summing in the digital domain, thus saving on area and power. Having described exemplary embodiments of this invention, it would now be apparent to one of ordinary skill in the art that other embodiments incorporating its concept may be used. For example, each of the embodiments described above incorporates inverter 130. However, if the input signal is periodic and the phase of the output is immaterial to the application, inverter 130 can be eliminated and comparator output 129 can operate as the output of the circuit providing a gain scaled output signal which is out of phase (i.e., 180 degrees out of phase) with respect to the input signal.

Alternatively, an input gain element similar to input gain element 109 can be employed in converter 1001 to provide finer scaling control. Similarly, multiple input signals similar to those provided to converter 401 of FIG. 4 could also be provided to converter 1001. In this case, separate input gain elements for each input signal would allow for independent scaling of the input signals. If converter 1001 employs an input gain element, it would function similarly to the input gain element shown in FIG. 2, except the input gain element would have multibit input samples in place of the one-bit sample shown on input line 111 in FIG. 2, and would have a multiplier in place of complementer 206 shown in FIG. 2. In essence, therefore, input gain element 109 shown in FIG. 2 can be viewed as a special case input gain element for the case where the input signal is a one-bit PDM signal. In such a case, instead of a multiplier, a simple complementer can be employed to scale the input signal as a function of a value stored in the input gain value register.

The invention claimed is:

1. A converter, comprising:
   a first summer adapted to produce a first output;
   an input gain element adapted to receive an input signal and provide a gain-adjusted signal to the first summer;
   a first delay unit adapted to receive the first output, produce a first delayed output and provide the first delayed output to the first summer;
   a second summer directly adapted to receive the first delayed output and produce a second output;
   a second delay unit adapted to receive the second output, produce a second delayed output, and provide the second delayed output to the second summer;
   a comparator adapted to receive the second delayed output and produce a comparator output; and
   a feedback gain element adapted to receive the comparator output and produce a first feedback signal and a second feedback signal, the first feedback signal to be provided to the first summer, and the second feedback signal to be provided to the second summer, whereby the comparator output represents a scaled version of the input signal.

2. A converter as recited in claim 1, wherein the input gain element is adapted to receive one-bit digital signals as the input signal and the comparator is adapted to produce one-bit digital scaled versions of the received one-bit digital signals as the comparator output signal.

3. A converter as recited in claim 1, further comprising an inverter adapted to receive the comparator output and produce an output signal, whereby the output signal is a scaled version of the input signal.

4. A converter as recited in claim 1, wherein the input gain element has an input gain factor and the feedback gain element has a feedback gain factor, the input gain factor and feedback gain factor being independently selectable, a scaling factor of the converter being a function of the input gain factor and the feedback gain factor.

5. A converter as recited in claim 1, wherein the scaling factor is the input gain factor divided by the feedback gain factor, such that the comparator output is representative of the input signal multiplied by the scaling factor.

6. A converter as recited in claim 1, wherein the second feedback signal is a fixed ratio with respect to the first feedback signal.

7. A converter as recited in claim 1, wherein the second feedback signal is twice the first feedback signal.

8. A sigma-delta scalar/summer, comprising:
a first summer adapted to produce a first output;
a plurality of input gain elements coupled to receive corresponding input signals and provide gain-adjusted signals to the first summer;
a first delay unit adapted to receive the first output and produce a first delayed output to be supplied to the first summer;
a second summer directly adapted to receive the first delayed output and produce a second output;
a second delay unit adapted to receive the second output and produce a second delayed output to be provided to the second summer;
a comparator adapted to receive the second delayed output and produce a comparator output; and
a feedback gain element adapted to receive the comparator output and produce a first feedback signal and a second feedback signal, the first feedback signal to be provided to the first summer, and the second feedback signal to be provided to the second summer,
wherein the comparator output represents a summed version of scaled input signals.

9. A sigma-delta scalar/summer as recited in claim 8, wherein the scaled input signals forming the comparator output are independently scaled.

10. A sigma-delta scalar/summer as recited in claim 9, wherein each input gain element has a corresponding input gain factor and the feedback gain element has a feedback gain factor, each input gain factor and the feedback gain factor being independently selectable, a scaling factor for each input signal being a function of the corresponding input gain factor and the feedback gain factor.

11. A sigma-delta scalar/summer as recited in claim 10, wherein the scaling factor for each input signal is the corresponding input gain factor divided by the feedback gain factor.

12. A converter, comprising:
a first summer producing a first output;
an input gain element receiving an input signal and providing a gain-adjusted signal to the first summer;
a first delay unit receiving the first output, producing a first delayed output and providing the first delayed output to the first summer;
a second summer directly receiving the first delayed output and producing a second output;
a second delay unit receiving the second output, producing a second delayed output, and providing the second delayed output to the second summer;
a comparator receiving the second delayed output and producing a comparator output; and
a feedback gain element receiving the comparator output and producing a first feedback signal and a second feedback signal, the first feedback signal being provided to the first summer, and the second feedback signal being provided to the second summer, whereby the comparator output represents a scaled version of the input signal.

13. A converter as recited in claim 12, wherein the input gain element receives one-bit digital signals as the input signal and the comparator produces one-bit digital scaled versions of the received one-bit digital signals as the comparator output signal.

14. A converter as recited in claim 12, wherein the input gain element receives multibit digital signals as the input signal, and the comparator produces one-bit digital scaled versions of the received multibit digital signals as the comparator output signal.

15. A converter as recited in claim 12, wherein the input gain element has an input gain factor and the feedback gain element has a feedback gain factor, the input gain factor and feedback gain factor being independently selectable, a scaling factor of the converter being a function of the input gain factor and the feedback gain factor.

16. A converter as recited in claim 12, wherein the scaling factor is the input gain factor divided by the feedback gain factor, such that the comparator output is representative of the input signal multiplied by the scaling factor.

17. A converter as recited in claim 12, wherein the second feedback signal is a fixed ratio with respect to the first feedback signal.

18. A converter as recited in claim 12, wherein the second feedback signal is twice the first feedback signal.

19. A sigma-delta scalar/summer, comprising:
a first summer producing a first output;
a plurality of input gain elements coupled to receive corresponding input signals and provide gain-adjusted signals to the first summer;
a first delay unit receiving the first output and producing a first delayed output to be supplied to the first summer;
a second summer directly receiving the first delayed output and producing a second output;
a second delay unit receiving the second output and producing a second delayed output to be provided to the second summer;
a comparator receiving the second delayed output and producing a comparator output; and
a feedback gain element receiving the comparator output and producing a first feedback signal and a second feedback signal, the first feedback signal to be provided to the first summer, and the second feedback signal to be provided to the second summer,
wherein the comparator output represents a summed version of scaled input signals.

20. A converter, comprising:
a first summer adapted to produce a first output;
an input gain element adapted to receive an input signal and provide a gain-adjusted signal to the first summer;
a first delay unit adapted to receive the first output, produce a first delayed output and provide the first delayed output to the first summer;
a second summer adapted to receive the first delayed output and produce a second output;
a second delay unit adapted to receive the second output, produce a second delayed output, and provide the second delayed output to the second summer;

a comparator adapted to receive the second delayed output and produce a comparator output; and a feedback gain element adapted to receive the comparator output and produce a first feedback signal and a second feedback signal, the first feedback signal to be provided to the first summer, and the second feedback signal to be provided to the second summer, whereby the comparator output represents a scaled version of the input signal, wherein the input gain element is adapted to receive one-bit digital signals as the input signal and the comparator is adapted to produce one-bit digital scaled versions of the received one-bit digital signals as the comparator output signal.

21. A converter as recited in claim 20, wherein the input gain element has an input gain factor and the feedback gain element has a feedback gain factor, the input gain factor and feedback gain factor being independently selectable, a scaling factor of the converter being a function of the input gain factor and the feedback gain factor.

22. A converter as recited in claim 21, wherein tho scaling factor is the input gain factor divided by the feedback gain factor, such that the comparator output is representative of the input signal multiplied by the scaling factor.

23. A converter as recited in claim 20, wherein the second feedback signal is a fixed ratio with respect to the first feedback signal.

24. A converter as recited in claim 20, wherein the second feedback signal is twice the first feedback signal.

25. A converter, comprising:

a first summer producing a first output;

an input gain element receiving an input signal and providing a gain-adjusted signal to the first summer;

a first delay unit receiving the first output, producing a first delayed output and providing the first delayed output to the first summer;

a second summer receiving the first delayed output and producing a second output;

a second delay unit receiving the second output, producing a second delayed output, and providing the second delayed output to the second summer;

a comparator receiving the second delayed output and producing a comparator output; and a feedback gain element receiving the comparator output and producing a first feedback signal and a second feedback signal, the first feedback signal being provided to the first summer, and the second feedback signal being provided to the second summer, whereby the comparator output represents a scaled version of the input signal, wherein the input gain element receives one-bit digital signals as the input signal and the comparator produces one-bit digital scaled versions of the received one-bit digital signals as the comparator output signal.

* * * * *